(12) United States Patent
Hishida et al.

(10) Patent No.: US 8,269,349 B2
(45) Date of Patent: Sep. 18, 2012

(54) SEMICONDUCTOR DEVICE (75) Inventors: Takeshi Hishida, Kanagawa (JP);
Tsutomu Igarashi, Kanagawa (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 96 days.

(21) Appl. No.: 12/647,221

(22) Filed: Dec. 24, 2009

(65) Prior Publication Data
US 2010/0164112 A1 Jul. 1, 2010

(30) Foreign Application Priority Data
Dec. 26, 2008 (JP) .................................. 2008-332453

(51) Int. Cl.
*H01L 23/485* (2006.01)

(52) U.S. Cl. ........ 257/761; 257/750; 257/751; 257/763; 257/773; 257/781; 257/E23.02; 257/E23.021; 438/612

(58) Field of Classification Search .................. 257/750, 257/751, 761, 763, 773, 781, E23.02, E23.021; 438/612
See application file for complete search history.

(56) References Cited

U.S. PATENT DOCUMENTS

| | | | | |
|---|---|---|---|---|
| 5,985,765 A | * | 11/1999 | Hsiao et al. | 438/694 |
| 6,650,021 B2 | * | 11/2003 | Stamper et al. | 257/786 |
| 2005/0146042 A1 | * | 7/2005 | Yamaha | 257/758 |

FOREIGN PATENT DOCUMENTS

JP 05-136197 6/1993

* cited by examiner

*Primary Examiner* — Peniel M Gumedzoe
(74) *Attorney, Agent, or Firm* — Westerman, Hattori, Daniels & Adrian, LLP (57) ABSTRACT

A semiconductor device includes a semiconductor layer, an electrode pad that is composed of Au and is provided on the semiconductor layer, a silicon nitride film provided on the semiconductor layer and the electrode pad so that an end portion of the silicon nitride film is located, and a metal layer that contacts a part of a surface of the electrode pad and the end portion of the silicon nitride film and is provided so that another part of the surface of the electrode pad is exposed, the metal layer including any of Ti, Ta and Pt.

6 Claims, 6 Drawing Sheets

SEMICONDUCTOR DEVICE

CROSS-REFERENCE TO RELATED APPLICATION

This application is based upon and claims the benefit of priority of the prior Japanese Patent Application No. 2008-332453, filed on Dec. 26, 2008, the entire contents of which are incorporated herein by reference.

BACKGROUND (i) Technical Field

The present invention relates to a semiconductor device, and more particularly, to a semiconductor device having a structure in which an electrode and a protective film are provided on or above a semiconductor layer.

(ii) Related Art

A protective film composed of an insulating material such as a silicon nitride (SiN) may be provided on the surface of a semiconductor layer to protect the semiconductor layer of a semiconductor device from stress and fouling.

There is a proposal to provide a ball of a bonding wire on an insulative cover film on a pad electrode to thus improve the degree of adhesion of the bonding wire and to prevent moisture penetration (see Japanese Laid-Open Patent Publication No. 5-136197).

In this proposal, if the ball and the insulative cover film does not have good coverage, a gap may be developed therebetween and moisture may penetrate therethrough. The moisture penetration may degrade the long-term reliability and corrode the pad electrode. This may result in exfoliation of the insulative film. When the ball is attached to the pad electrode with pressure, a crack may occur in the insulative cover film.

SUMMARY

It is an object of the present invention to provide a more reliable semiconductor device having a structure that suppresses moisture penetration in a boundary between a protective film and an electrode pad.

According to an aspect of the present invention, there is provided a semiconductor device including: a semiconductor layer; an electrode pad that is composed of Au and is provided on the semiconductor layer; a silicon nitride film provided on the semiconductor layer and the electrode pad, an end portion of the silicon nitride film being located on the electrode pad; and a metal layer that contacts a part of a surface of the electrode pad and the end portion of the silicon nitride film and is provided so that another part of the surface of the electrode pad is exposed, the metal layer including any of Ti, Ta and Pt.

BRIEF DESCRIPTION OF THE DRAWINGS

Other objects, features, and advantages of the present invention will become more apparent from the following detained description when read in conjunction with the accompanying drawings, in which.

DESCRIPTION OF EMBODIMENTS

A description will now be given, with reference to the accompanying drawings, of embodiments of the present invention.

First Embodiment

Figure 1:
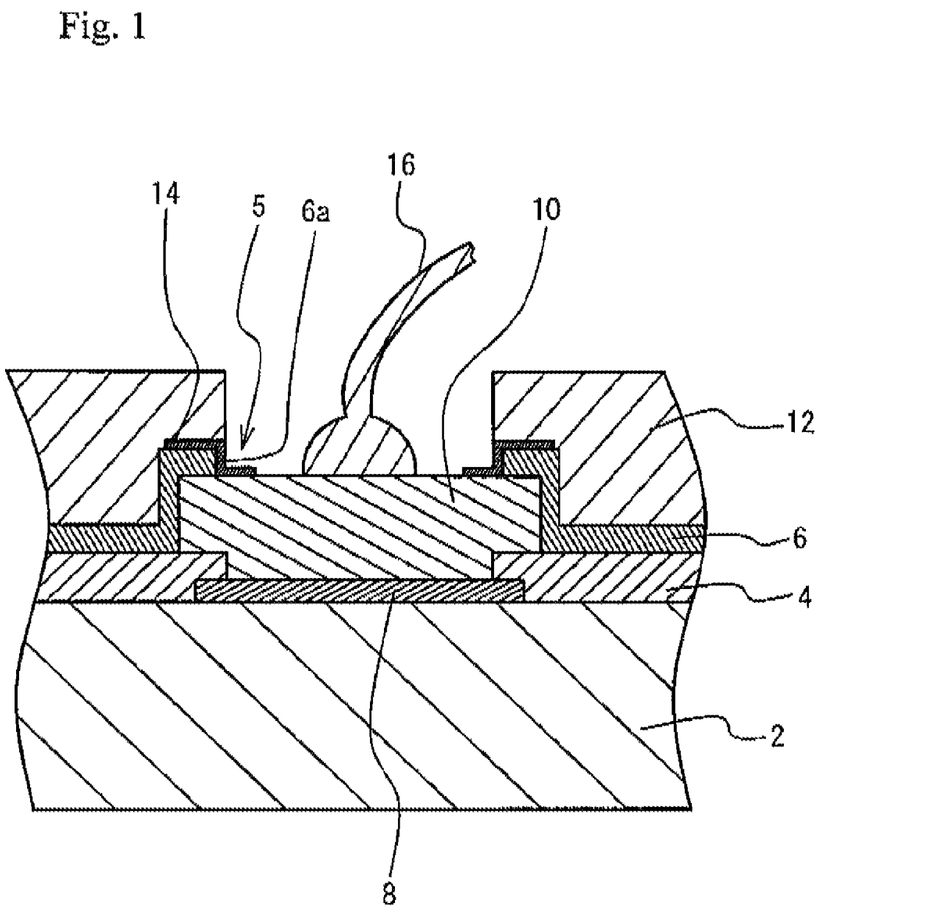
FIG. 1 is a cross-sectional view of a semiconductor device in accordance with a first embodiment.

FIG. 1 is a cross-sectional view of a semiconductor device in accordance with a first embodiment. Referring to FIG. 1, the semiconductor device has a semiconductor layer 2 composed of GaAs, for example. An ohmic electrode 8, which may contain metals such as AuGe, is provided on the semiconductor layer 2. A first silicon nitride film 4, which may be 1 μm thick, for example, is provided on the semiconductor layer 2 so that the upper surface of the ohmic electrode 8 is exposed. An electrode pad 10, which may be made of a metal such as Au, is provided on the exposed upper surface of the ohmic electrode 8 so as to be electrically connected thereto. A second silicon nitride film 6, which may be 1 μm thick, for example, is provided on the first silicon nitride film 4 and the electrode pad 10 so that an end portion 6a of the second insulating film 6 is provided on the electrode pad 10 and the upper surface of the electrode pad 10 is exposed. An opening 5 having a size of, for example, 80 μm×80 μm is provided in the second silicon nitride film 6 so that the upper surface of the electrode pad 10 is exposed. A polyimide film 12 having a thickness of, for example, 3 μm is provided on the second silicon nitride film 6 so that the upper surface of the electrode pad 10 is exposed. The polyimide layer 12 protects the uppermost surface of the semiconductor device. Polyimide may be replaced by another material such as benzocyclobutene (BCB).

A Ti layer 14, which may, for example, be 5 to 20 nm thick, is continuously provided from the surface of the electrode pad 10 to the surface of the second silicon nitride film 6 in such a manner that the Ti layer 14 contacts a part of the upper surface of the electrode pad 10 and the end portion 6a of the second silicon nitride film 6 and exposes another part of the upper surface of the electrode pad 10 (which does not contact the Ti layer 14).

Ti has high adhesion to silicon nitride and Au used for the electrode pad 10 and excellent resistance to corrosion caused by moisture. Thus, the first embodiment is capable of suppressing moisture penetration in the boundary between the second silicon nitride film 6 and the electrode pad 10 (indicated by a reference numeral of 30 in FIG. 5). It is thus possible to suppress corrosion of the ohmic electrode 8 due to moisture as well as a short circuit caused in such a manner that the metal that forms the ohmic electrode 8 is dissolved in penetrating moisture and to improve the reliability of the semiconductor device.

There is a possibility that a crack or exfoliation may occur in the Ti layer 14 due to stress applied in the bonding step in a case where a wire 16 is provided on the Ti layer 14 or the Ti layer 14 is in contact with the wire 16. The occurrence of a crack or exfoliation may cause moisture to penetrate through the boundary between the first silicon nitride film 4 and the electrode pad 10 and degrade the reliability of the semiconductor device. The first embodiment is configured to take the above into account and provide the Ti layer 14 on only the end portion 6a of the electrode pad 10. With this structure, the wire 16 may be bonded to the area on the electrode pad 10 which is in the absence of the Ti layer 14 so that the wire 16 can be separated from the Ti layer 14. Preferably, the distance between the Ti layer 14 and the wire 16 is 10 μm, for example.

The moisture penetration may be suppressed by a metal other than Ti, which metal has high adhesion to the metal that forms the electrode pad 10 and silicon nitride. Examples of such a metal are Pt and Ta. Further, the Ti layer may be replaced with an Rn or Nb layer. The electrode pad 10 may be composed of not only Au but also another metal having high adhesion to Ti. An example of such metal is AuGe.

The thickness of the Ti layer 14 is uniform and is large enough to secure the satisfactory adhesion to the second silicon nitride film 6 and the electrode pad 10. More specifically, the Ti layer 14 that is 3 nm thick or more has a uniform thickness and high adhesion with the second silicon nitride film 6 and the electrode pad 10. Preferably, the Ti layer 14 is 20 nm thick or less in order to smooth the step of the Ti layer 14. More preferably, the Ti layer 14 is 15 nm thick or less in order to further smooth the step of the Ti layer 14. When the Ti layer 14 is 10 nm thick or less, the step of the Ti layer 14 is smoothed more greatly.

The semiconductor layer 2 is not limited to GaAs but may be made of a GaAs-based semiconductor, InP-based semiconductor or GaN-based semiconductor. The GaAs-based semiconductor is a semiconductor that includes Ga and As, and may be GaAs, InGaAs, AlGaAs or the like. The InP-based semiconductor is a semiconductor that includes In and P, and may be InP, InGaAsP, InAlGaP, InAlGaAsP or the like. The GaN-based semiconductor is a semiconductor that includes Ga and N, and may be GaN, InGaN, AlGaN, InAlGaN or the like.

Figure 2A:
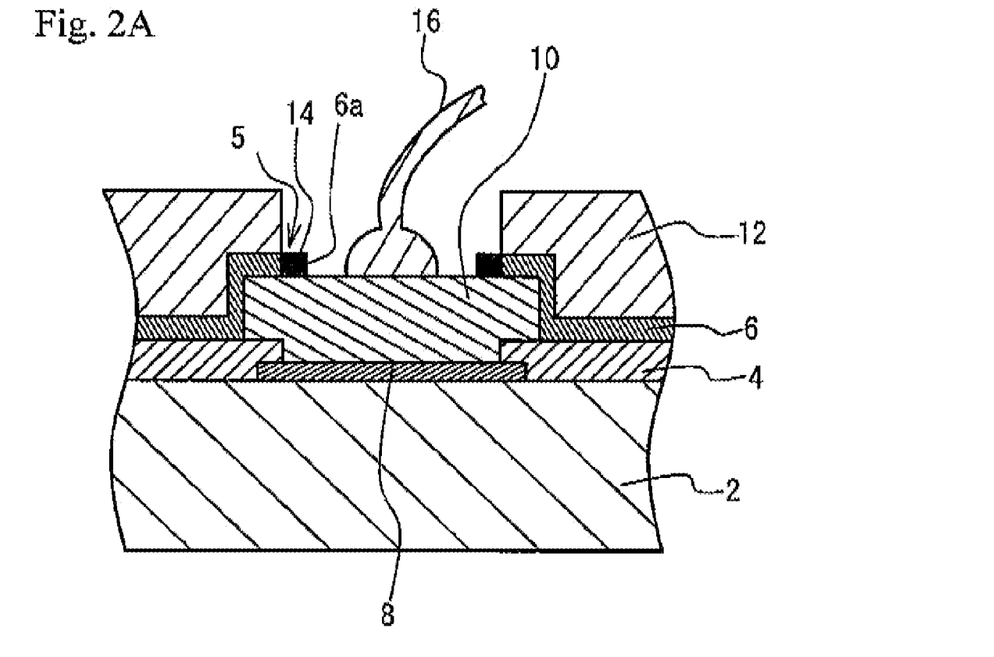
FIGS. 2A and 2B are cross-sectional views of variations of the first embodiment.
Figure 2B:
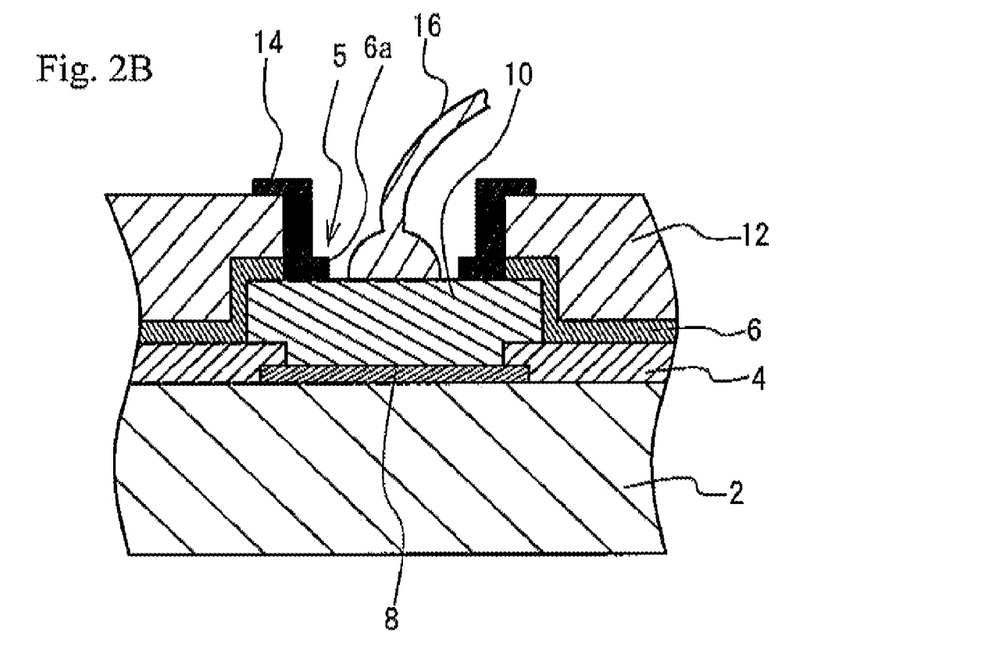

Variations of the semiconductor of the first embodiment are now described. FIGS. 2A and 2B are cross-sectional views of semiconductor devices in accordance with variations of the first embodiment. In FIGS. 2A and 2B, parts that are the same as those previously described are given the same reference numerals, and a description thereof is omitted.

Referring to FIG. 2A, the Ti layer 14 is provided on the electrode pad 10 so that the Ti layer 14 contacts the upper surface of the electrode pad 10 and the end portion 6a of the second silicon nitride film 6 and exposes the upper surface of the electrode pad 10. The Ti layer 14 is not provided on the second silicon nitride film 6. As long as the Ti layer 14 contacts the upper surface of the electrode pad 10 and the end portion 6a of the second silicon nitride film 6, it is possible to suppress the moisture penetration through the boundary between the second silicon nitride film 6 and the electrode pad 10.

Referring to FIG. 2B, the Ti layer 14 is continuously provided from the surface of the electrode pad 10 to the surface of the polyimide layer 12 so that the Ti layer 14 contacts the upper surface of the electrode pad 10 and the end portion 6a of the second silicon nitride film 6 and exposes the upper surface of the electrode pad 10. With this structure, it is possible to suppress the moisture penetration through not only the boundary between the second silicon nitride film 6 and the electrode pad 10 but also through the second silicon nitride film 6 and the polyimide layer 12.

Second Embodiment

Figure 3:
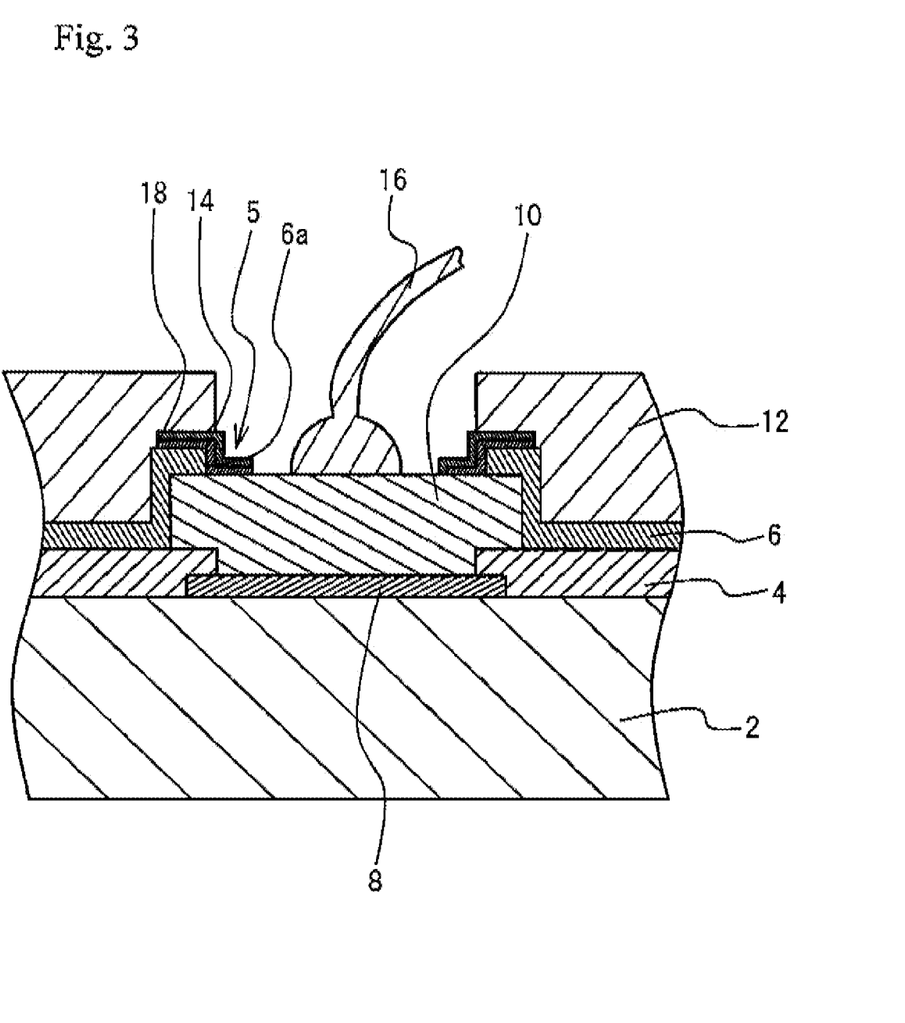
FIG. 3 is a cross-sectional view of a semiconductor device in accordance with a second embodiment.

A second embodiment is an exemplary semiconductor device in which an Au layer is provided on Ti. FIG. 3 is a cross-sectional view of a semiconductor device in accordance with the second embodiment, in which parts that are the same as those previously described are given the same reference numerals.

Referring to FIG. 3, an Au layer 18, which may be 200 to 500 nm thick, for example, is provided on the upper surface of the Ti layer 14 so as to overlay the Ti layer 14.

Ti has high resistance to etching. Accordingly, when a patterning to form the first Ti layer 14 is performed, a resist may be etched quicker than the first Ti layer 14, and the first Ti layer 14 may not be formed. Further, a step is formed in the opening 5 in the second silicon nitride film 6 so as to extend from the upper surface of the electrode pad 10 to the upper surface of the second silicon nitride film 6. The above step forms a step in the Ti layer 14 in the vicinity of the end portion 6a of the second silicon nitride film 6 and thins the Ti layer 14. In this case, good resistance to moisture may not be obtained.

With the above in mind, in the step of forming the Ti layer 14, the Au layer 18 is formed on a layer finally formed into the Ti layer 14 by sputtering, for example, and is used as a mask to form the Ti layer 14. According to the second embodiment, the Ti layer is formed reliably. Further, the Ti layer 14 is protected by the Au layer 18, resistance to moisture can be secured. The Au layer 18 may be formed by, for example, plating.

Third Embodiment

Figure 4A:
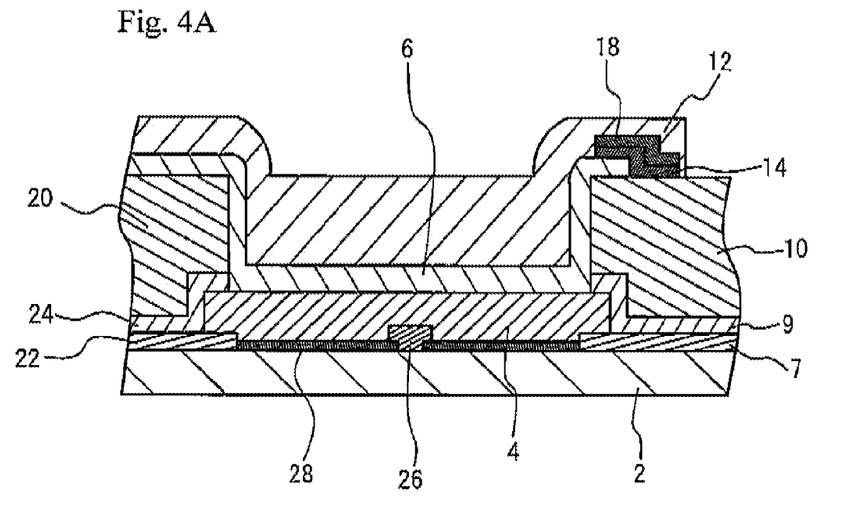
FIG. 4A is a cross-sectional view of a semiconductor device in accordance with a third embodiment.
Figure 4B:
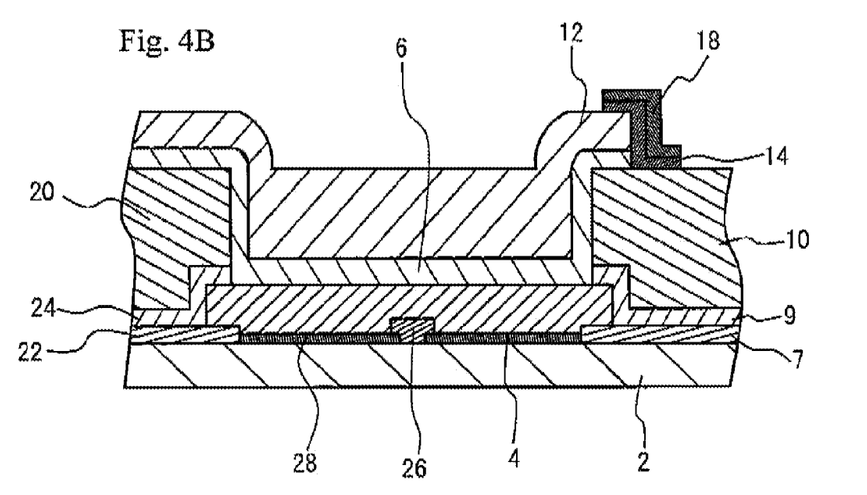
FIG. 4B is a cross-sectional view of a semiconductor device in accordance with a variation of the third embodiment.

A third embodiment is an exemplary FET (Field Effect Transistor). FIG. 4A is a cross-sectional view of a semiconductor device in accordance with the third embodiment, and FIG. 4B is a cross-sectional view of a semiconductor device in accordance with a variation of the first embodiment.

Referring to FIG. 4A, a drain electrode (ohmic electrode) 7 and a source electrode (ohmic electrode) 22 are formed on the semiconductor layer 2 composed of, for example, GaAs. Each of the electrodes 7 and 22 may have a metal multilayer structure such as AuGe/Ni/Au in which AuGe is closest to the semiconductor layer 2. A gate electrode 26 is provided on the semiconductor layer 2 and is located between the drain electrode 7 and the source electrode 22. The gate electrode 26 may have a metal multilayer structure such as WSi/Ti/Au in which WSi is closest to the semiconductor layer 2. A silicon nitride film 28, which may, for example, be 50 nm thick, is provided between the drain electrode 7 and the gate electrode 26 and between the source electrode 22 and the gate electrode 26. The first silicon nitride film 4, which may, for example, be 1 μm, is provided on the drain electrode 7, the source electrode 22, the gate electrode 26 and the silicon nitride film 28.

A metal layer 9 composed of metals such as TiW/Au is provided on the drain electrode 7 so as to be electrically connected to the drain electrode 7. The electrode pad 10 made of a metal such as Au is provided on the metal layer 9 so as to be electrically connected thereto. That is, the electrode pad 10 is electrically connected to the FET.

A metal layer 24 made of metals such has TiW/Au is provided on the source electrode 22 so as to be electrically connected thereto. An electrode pad 20 made of a metal such as Au is provided on the metal layer 24 so as to be electrically connected thereto.

The second silicon nitride film 6, which may be 1 μm thick, for example, is provided on the first silicon nitride film 4 and the electrode pads 10 and 20 so that the end portion 6a of the second silicon nitride film 6 is located on the electrode pad 10. The polyimide layer 12 is provided on the second silicon nitride film 6 and the electrode pad 10. That is, the FET is formed on the semiconductor layer 2.

As in the case of FIG. 3, the Ti layer 14 is continuously provided from the surface of the electrode pad 10 to the surface of the second silicon nitride film 6 so as to contact the upper surface of the electrode pad 10 and the end portion 6a of the second silicon nitride film 6. The Au layer 18 is provided on the upper surface of the Ti layer 14 so as to overlay the Ti layer 14. According to the third embodiment, it is possible to suppress moisture penetration through the boundary between the second silicon nitride film 6 and the electrode pad 10. It is thus possible to prevent the drain electrode 7, the source electrode 22 and the gate electrode 26 from corroding due to moisture penetration. It is thus possible to suppress a short circuit caused in such a manner that a component of the electrode pad 10 is dissolved in penetrating moisture and is deposited on the metal layer 9 or the electrode 20. Consequently, the reliability of the semiconductor device is improved.

Referring to FIG. 4B, the Ti layer 14 has a different shape. The Ti layer 14 is continuously provided from the surface of the electrode pad 10 to the surface of the polyimide layer 12 so that the Ti layer 14 contacts the upper surface of the electrode pad 10 and the end portion 6a of the second silicon nitride film 6. Thus, as in the case of FIG. 2B, it is possible to suppress moisture penetration through not only the boundary between the second silicon nitride film 6 and the electrode pad 10 but also the boundary between the second silicon nitride film 6 and the polyimide layer 12.

According to the third embodiment, the Ti layer 14 provided to suppress moisture penetration suppresses corrosion of the drain, source and gate electrodes and a short circuit. The FET of the third embodiment has excellent moisture resistance.

Figure 5:
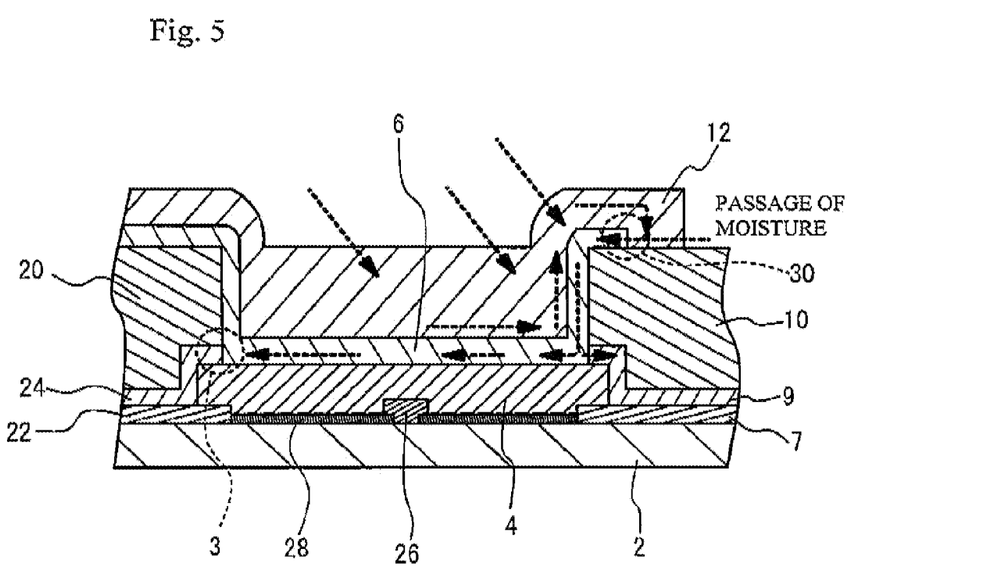
FIG. 5 is a cross-sectional view of a semiconductor device in accordance with a comparative example.

Now, a description will be given of the result of a moisture resistance test. Samples used for the test will be described first. FIG. 5 is a cross-sectional view of a semiconductor device used as a comparative example. As illustrated in FIG. 5, the comparative example is the same as the semiconductor device illustrated in FIG. 4A except that the comparative example does not have the Ti layer 14 and the Au layer 18.

The samples are the FET illustrated in FIG. 4A and the FET illustrated in FIG. 5. In each sample, the semiconductor layer 2 is composed of GaAs, and the drain electrode 7 and the source electrode 22 are composed of AuGe/Ni/Au. The gate electrode 26 is composed of by WSi/Ti/Au in which WSi is closest to the semiconductor layer 2. The metal layers 9 and 24 are formed by TiW/Au, and the electrode pads 10 and 20 are made of Au.

The Ti layer 14 is 5 nm thick, and the Au layer 18 is 200 nm thick. The length in which the Ti layer 14 is in contact with the semiconductor layer is 2.6 μm. The length in which the Ti layer 14 is in contact with the electrode pad 10 is 2.0 μm. Now the test condition will be described.

Figure 6:
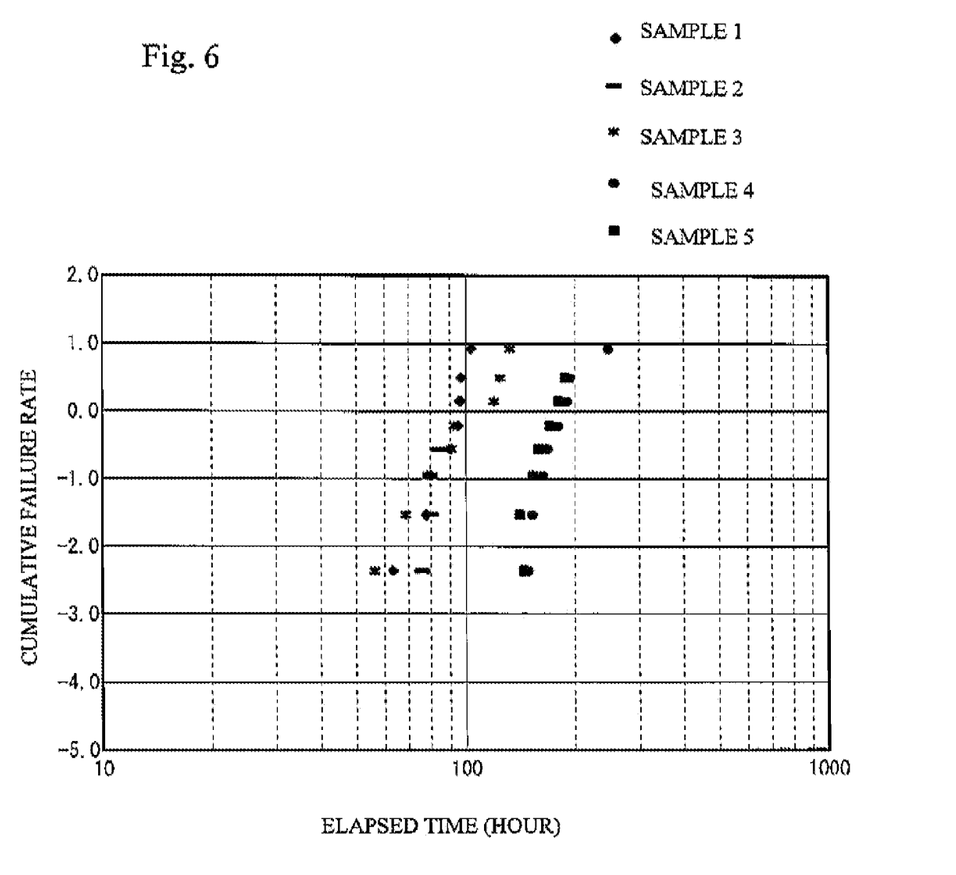
FIG. 6 is a Weibull chart that illustrates the results of a moisture resistance test.

The samples are placed under the circumstance where temperature is 130° C. and humidity is 85% and are supplied with a source-drain voltage VDS of 28 V and a gate-source voltage VGS of −2 V. The life of each sample is measured under the above circumstance. FIG. 6 illustrates results of the test.

FIG. 6 is a Weibull chart that illustrates the results of the test. The horizontal axis is the elapsed time and the vertical axis is the cumulative failure rate. Samples 1 through 3 are those in accordance with the comparative example, and samples 4 and 5 are those in accordance with the third embodiment.

As depicted in FIG. 6, the durations of life of samples 4 and 5 are longer than those of samples 1 through 3 and are over 100 hours. Further, the durations of life of samples 1 through 5 are estimated under the condition that the activation energy Ea is equal to 1.0 eV and the relative moisture acceleration factor n is equal to 2. The estimated durations of 0.1% life of the third embodiments are 117 years, and are greater than twice those of the comparative examples under the condition that the temperature is 30° C., the moisture is 70%, $V_{DS}$ is equal to 28 V and $V_{GS}$ is equal to −3V.

As indicated by arrows in FIG. 5, in the comparative example, moisture penetrates through the boundary (a portion 30) between the second silicon nitride film 6 and the electrode pad 10. Moisture penetrates through the polyimide layer 12 and reaches the surface of the second silicon nitride film 6. Silicon nitride and polyimide have low adhesion, and the second silicon nitride film 6 is covered with the polyimide layer 12. Thus, moisture is not allowed to penetrate through the second silicon nitride film 6. Moisture moves along the boundary between the second silicon nitride film 6 and the polyimide layer 12 and penetrates through the boundary (portion 30) between the second silicon nitride film 6 and the electrode pad 10. Au that forms to the electrode pad 10 is dissolved in penetrating moisture. When moisture including dissolved Au reaches the portion 30 surrounded by a broken line, Au is deposited on the metal layer 24 and the electrode pad 20, and a short circuit between the electrode pads 10 and 20 may take place. Further, moisture entering through the portion 30 penetrates through the boundary between the electrode pad 10 and the second silicon nitride film 6 and corrodes the drain electrode 7. Thus, the durations of life of the sample FETS of the comparative example are shortened.

In contrast, the third embodiment employs the Ti layer 14 and the Au layer 18. It is thus possible to suppress moisture penetration and the occurrence of a short circuit and to elongate the lift of FETs. The Ti layer 14 realizes FETs having excellent moisture resistance.

The present invention is not limited to the specifically described embodiments and variations, but includes other embodiments and variations without departing from the scope of the present invention.

What is claimed is:

1. A semiconductor device comprising:
a semiconductor layer;
an electrode pad that is composed of Au and is provided on the semiconductor layer;
a silicon nitride film provided on the semiconductor layer and the electrode pad, end portions of the silicon nitride film being located directly on both sides of an upper surface of the electrode pad;
a metal layer that contacts a part of the upper surface of the electrode pad and side surfaces of the silicon nitride film that are directly connected to the upper of the electrode pad, and is continuously provided from the upper surface of the electrode pad to the side surfaces of the silicon nitride film so that another part of the upper surface of the electrode pad is exposed and located at a center area of the electrode pad, the metal layer including any of titanium, tantalum and platinum; and
a wire that is connected to the another part of the upper surface of the electrode pad and is separated from the metal layer.

2. The semiconductor device according to claim 1, further comprising one of a polyimide layer and a benzocyclobutene layer provided on the silicon nitride film.

3. A semiconductor device comprising,
a semiconductor layer;
an electrode pad that is composed of Au and is provided on the semiconductor layer;

a silicon nitride film provided on the semiconductor layer and the electrode pad, end portions of the silicon nitride film being located directly on both sides of the electrode pad, a metal layer that contacts a part of a surface of the electrode pad and side surfaces of the silicon nitride film and is provided so that another part of the surface of the electrode pad is exposed and located at a center area of the electrode pad, the metal layer including any of titanium, tantalum and platinum, a wire that is connected to the another part of the surface of the electrode pad and is separated from the metal layer; and one of a polyimide layer and a benzocyclobutene layer provided on the silicon nitride film, wherein the metal layer is provided from the part of the surface of the electrode pad to a surface of the one of the polyimide layer and the benzocyclobutene layer.

4. A semiconductor device comprising, a semiconductor layer;

an electrode pad that is composed of Au and is provided on the semiconductor layer;

a silicon nitride film provided on the semiconductor layer and the electrode pad, end portions of the silicon nitride film being located directly on both sides of the electrode pad, a metal layer that contacts a part of a surface of the electrode pad and side surfaces of the silicon nitride film and is provided so that another part of the surface of the electrode pad is exposed and located at a center area of the electrode pad, the metal layer including any of titanium, tantalum and platinum, a wire that is connected to the another part of the surface of the electrode pad and is separated from the metal layer; and an Au layer provided so as to contact a surface of the metal layer.

5. A semiconductor device comprising, a semiconductor layer;

an electrode pad that is composed of Au and is provided on the semiconductor layer;

a silicon nitride film provided on the semiconductor layer and the electrode pad, end portions of the silicon nitride film being located directly on both sides of the electrode pad, a metal layer that contacts a part of a surface of the electrode pad and side surfaces of the silicon nitride film and is provided so that another part of the surface of the electrode pad is exposed and located at a center area of the electrode pad, the metal layer including any of titanium, tantalum and platinum, a wire that is connected to the another part of the surface of the electrode pad and is separated from the metal layer; and one of a polyimide layer and a benzocyclobutene layer provided on the silicon nitride film, wherein the metal layer is provided from the part of the surface of the electrode pad to an end portion of the one of the polyimide layer and the benzocyclobutene layer.

6. A semiconductor device comprising:

a semiconductor layer;
an electrode pad that is composed of Au and is provided on the semiconductor layer;

a silicon nitride film provided on the semiconductor layer and the electrode pad, end portions of the silicon nitride film being located directly on both sides of an upper surface of the electrode pad; and a metal layer that contacts a part of the upper surface of the electrode pad and side surfaces of the silicon nitride film that is directly connected to the upper surface of the electrode pad, and is continuously provided from the upper surface of the electrode pad to the side surfaces of the silicon nitride film so that another part of the upper surface of the electrode pad is exposed and located at a center area of the electrode pad, the metal layer including any of titanium, tantalum and platinum, wherein a part of the metal layer is sandwiched between the silicon nitride film and one of a polyimide layer and a benzocyclobutene layer provided on the silicon nitride film, wherein the another part of the upper surface of the electrode pad is a region that is to be connected to a wire.

* * * * *